United States Patent
Lee et al.

(10) Patent No.: US 6,992,270 B2
(45) Date of Patent: Jan. 31, 2006

(54) WAFER BAKE SYSTEM AND METHOD FOR OPERATING THE SAME

(75) Inventors: Dong-Woo Lee, Seoul (KR); Jin-Sung Lee, Seoul (KR); Sang-Kap Kim, Osan-si (KR); Dong-Hwa Shin, Suwon-si (KR); Tae-Gyu Kim, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/924,287

(22) Filed: Aug. 23, 2004

(65) Prior Publication Data

US 2005/0082273 A1    Apr. 21, 2005

(30) Foreign Application Priority Data

Aug. 22, 2003    (KR)    ............ 10-2003-0058332

(51) Int. Cl.
*H05B 3/68* (2006.01)
*C23C 16/00* (2006.01)

(52) U.S. Cl. .................. 219/444.1; 118/724
(58) Field of Classification Search ............ 219/444.1; 118/724, 725, 723 VE, 729; 310/327, 328; 432/253

See application file for complete search history.

(56) References Cited

U.S. PATENT DOCUMENTS

| | | | | |
|---|---|---|---|---|
| 5,563,684 A | * | 10/1996 | Stagaman | ............... 355/72 |
| 6,313,567 B1 | * | 11/2001 | Maltabes et al. | ........... 310/328 |
| 6,402,509 B1 | * | 6/2002 | Ookura et al. | ............. 432/253 |
| 6,465,763 B1 | * | 10/2002 | Ito et al. | ................. 219/444.1 |
| 6,478,578 B2 | * | 11/2002 | Choi et al. | ................. 432/253 |

* cited by examiner

*Primary Examiner*—Sang Y. Paik
(74) *Attorney, Agent, or Firm*—Dilworth & Barrese LLP

(57) ABSTRACT

A wafer bake system includes a heating plate for heating a wafer, and means for supporting the wafer to be spaced from the heating plate, wherein a gap distribution between the wafer and the heating plate is measured, and a temperature gradient of the wafer is controlled based on the measured gap distribution.

9 Claims, 8 Drawing Sheets

US 6,992,270 B2

WAFER BAKE SYSTEM AND METHOD FOR OPERATING THE SAME

PRIORITY

This application claims priority to an application entitled "WAFER BAKE SYSTEM AND METHOD FOR OPERATING THE SAME", filed in the Korean Intellectual Property Office on Aug. 22, 2003 and assigned Serial No. 2003-58332, the contents of which are incorporated herein by reference.

BACKGROUND OF THE INVENTION

1. Field of the Invention

The present invention generally relates to a system for processing a wafer, and more particularly to a wafer bake system.

2. Description of the Related Art

In a conventional semiconductor fabrication process, a semiconductor element pattern is formed on a wafer by a series of steps of depositing a photoresist layer on the wafer, supplying light to the photoresist layer and developing the photoresist layer, and then the wafer is baked before and after the above-described steps. The wafer is deformed depending on process systems, photoresist solutions and processing methods. As more large-sized wafers are needed, deformation of the wafer is a major problem in the production of the wafer. When the deformed wafer is baked, a proximity gap between the wafer and a heating plate is not uniform, thereby generating a temperature gradient in the wafer. The temperature gradient causes critical dimensional problems on the wafer. The critical dimensions refer to the minimum line width reproduced on the wafer when the shape of a mask is copied onto the wafer.

Accordingly, a wafer bake system for preventing the temperature gradient in the wafer is required. Thus, several aspects must be considered when the wafer bake system is designed. When the structure of the heating plate is modified, it is difficult to obtain uniform thermal transfer. Further, the contact between the heating plate and the wafer causes contamination on the wafer and differences in temperature in the region between contact and non-contact portions of the heating plate and the wafer.

However, the conventional wafer bake system is disadvantageous because it can't effectively prevent non-uniform temperature gradient in the wafer.

SUMMARY OF THE INVENTION

Accordingly, the present invention has been made in view of the above-described problems occurring in the prior art, and it is an object of the present invention to provide a wafer bake system for efficiently preventing the generation of a temperature gradient in a wafer, and a method for operating the wafer bake system.

In accordance with one aspect of the present invention, the above and other objects can be accomplished using a wafer bake system having a heating plate for heating a wafer, and a supporting unit for supporting the wafer when the wafer is spaced from the heating plate, wherein gap distribution between the wafer and the heating plate is measured, and the temperature gradient in the wafer is controlled by the measured gap distribution.

In accordance with another aspect of the present invention, a method for operating a wafer bake system includes a heating plate for heating a wafer, and a supporting unit for supporting the wafer when the wafer is spaced from the heating plate, including the steps of mounting a wafer having an uneven surface on the supporting unit; controlling the height of the wafer so that the wafer contacts the supporting unit; and fixing the supporting unit to the wafer, and deforming the wafer using the supporting unit.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Preferred embodiments of the present invention will be described in detail with reference to the annexed drawings. In the following description of the present invention, a detailed description of known functions and configurations incorporated herein will be omitted for clarity where they are well known in the art.

Figure 1:
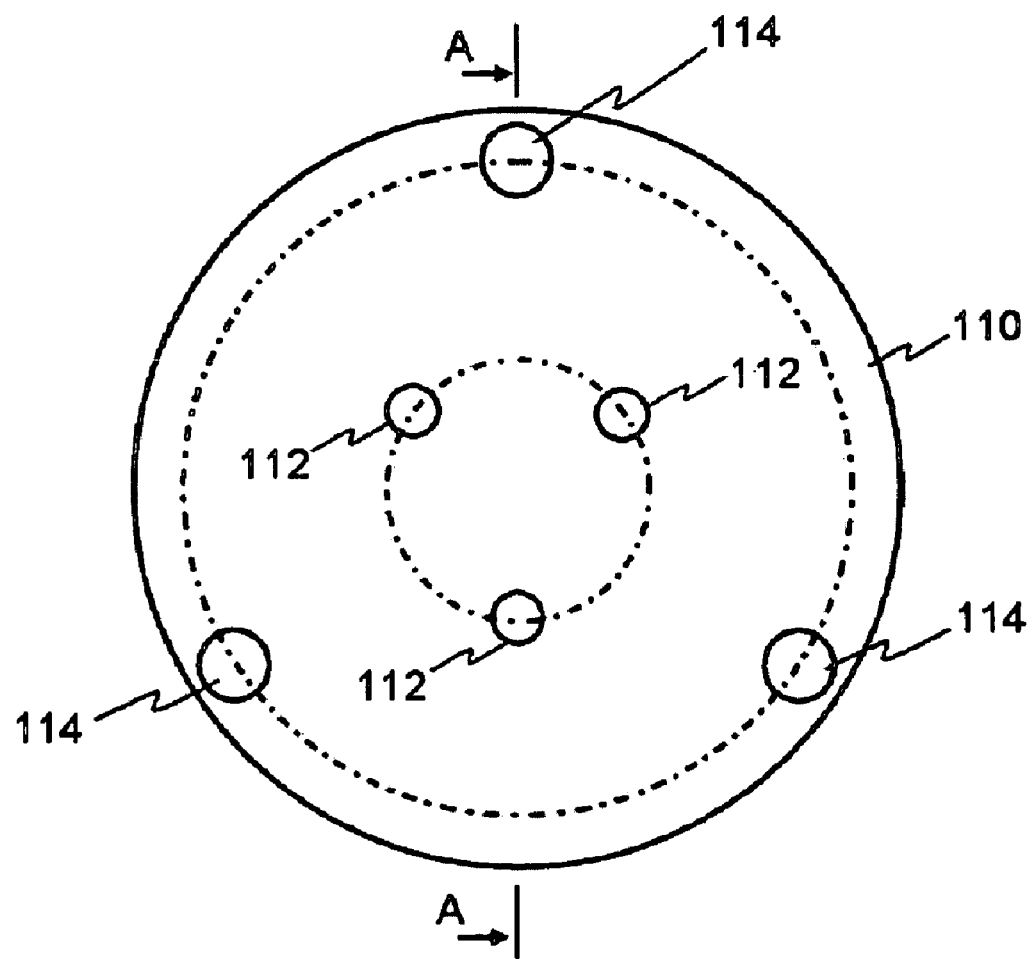
FIG. 1 is a plan view of a heating plate in accordance with a first preferred embodiment of the present invention.
Figure 2:
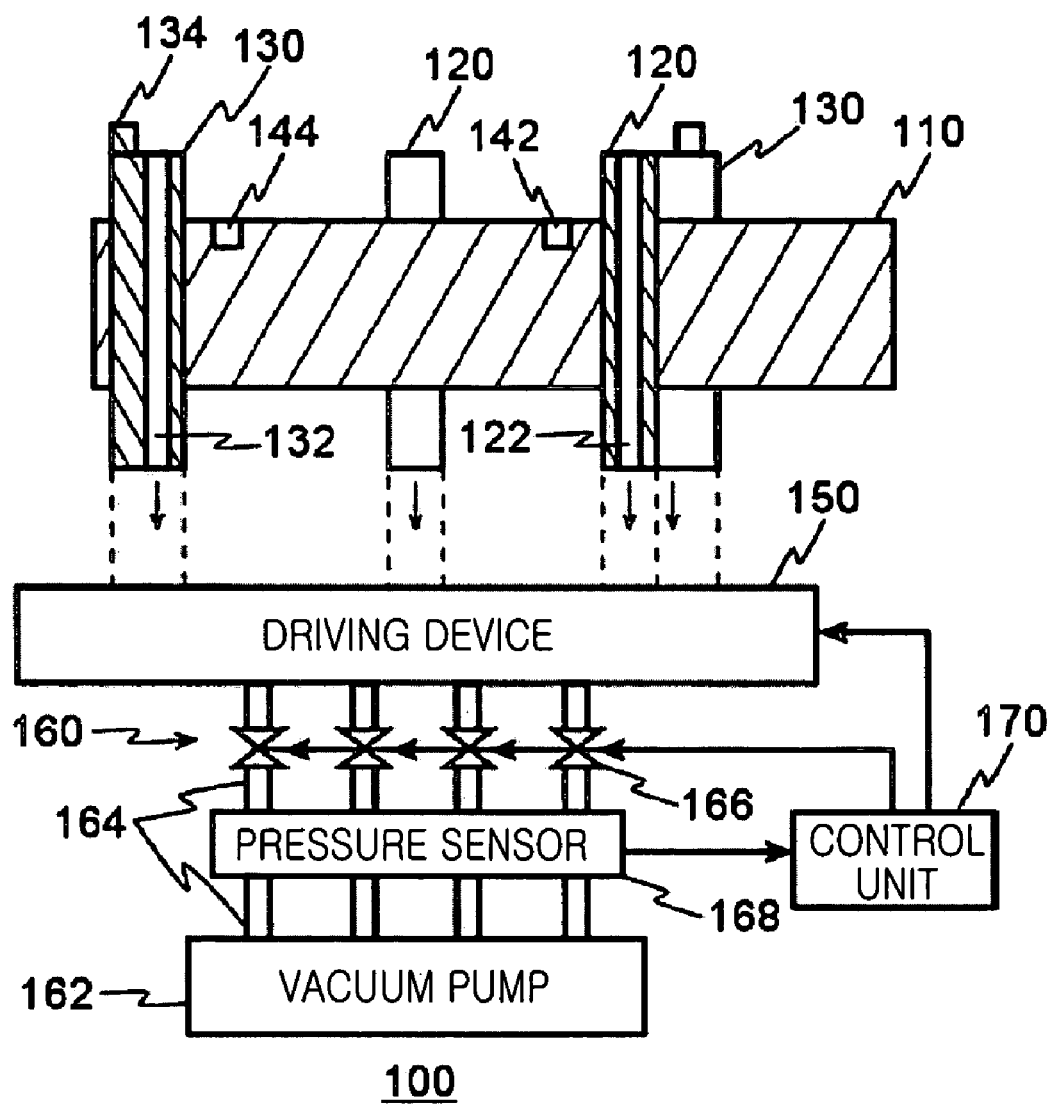
FIG. 2 is a side cross-sectional view taken along the line A–A' of FIG. 1, illustrating the constitution of a wafer bake system in accordance with the first preferred embodiment of the present invention.

FIG. 1 is a plan view of a heating plate in accordance with a first preferred embodiment of the present invention, and FIG. 2 is a side cross-sectional view taken along the line A–A' of FIG. 1, illustrating the construction of a wafer bake system in accordance with the first preferred embodiment of the present invention. The wafer bake system 100 includes the heating plate 110, inside proximity pins 120, outside proximity pins 130, gap sensors 142 and 144, a vacuum device 160, a driving device 150, and a control unit 170.

As illustrated in FIGS. 1 and 2, the heating plate 110 includes three first inside through holes 112 formed through an inside portion of the heating plate 110, and three first outside through holes 114 formed through the outside portion of the heating plate 110. The first inside through holes 112 are disposed at vertices of one imaginary regular triangle respectively, and the first outside through holes 114 are disposed at vertices of another imaginary regular triangle respectively. The two imaginary regular triangles are displaced from each other by 45 degrees. The number and arrangement of the first inside and outside through holes 112 and 114 are designed such that the inside and outside proximity pins 120 and 130 stably support a wafer. Furthermore, the number and arrangement of the first inside and outside through holes 112 and 114 can be randomly modified. The heating plate 110 heats the wafer to a predetermined temperature.

The inside and outside proximity pins 120 and 130 are inserted into the first inside and outside through holes 112 and 114 so that the inside and outside proximity pins 120 and 130 partially protrudes from an upper surface of the heating plate 110, and include second through holes 122 and 132 formed therein, respectively. The inside and outside proximity pins 120 and 130 move vertically, and are drawn onto the wafer by suction. Each of the outside proximity pins 130 includes guides 134 protruding from the upper end thereof, and the guides 134 prevent the wafer from deviating from a predetermined position and moving parallel with the movement of the heating plate 110. When the wafer deviates from the predetermined position and then moves parallel, a side surface of the wafer contacts the guides 134 and is caught by the corresponding guides 134, thereby stopping the movement of the wafer.

The gap sensors 142 and 144 are provided at the inside and outside portions on the heating plate 110, and measure a gap between the wafer and the heating plate 110 and transmit the measured gap data to the control unit 170. The gap sensor 142 provided at the inside portion on the heating plate 110 is located close to the inside proximate pin 120, and the gap sensor 144 provided at the outside portion on the heating plate 110 is located close to the outside proximate pin 130. Optical gap sensors, which emit light to a lower surface of the wafer and obtain the gap data using the light reflected by the lower surface of the wafer, or capacitive gap sensors, which obtain the gap data using the variation in capacitance according to the variation in the gap between the wafer and the heating plate 110, may be used as the gap sensors 142 and 144.

The driving device 150 controls the movement of the inside and outside proximate pins 120 and 130, and moves the inside and outside proximate pins 120 and 130 along the corresponding first inside and outside through holes 112 and 114 based on the obtained control signals. For example, the driving device 150 includes a plurality of piezoelectric devices, which are provided with ends connected to the lower ends of the corresponding inside and outside proximity pins 120 and 130, and can expand or contract in the longitudinal direction of the inside and outside proximity pins 120 and 130.

The vacuum device 160 is connected to the second through holes 122 and 132 of the inside and outside proximity pins 120 and 130, and exhausts gas in the second through holes 122 and 132. Thus, the inside and outside proximity pins 120 and 130 are drawn onto the wafer by suction. Accordingly, the vacuum device 160 includes a plurality of vacuum lines 164 connected to the second through holes 122 and 132 respectively, a vacuum pump 162 connected to the vacuum lines 164, a plurality of valves 166 installed on the corresponding vacuum lines 164 respectively and opened and closed according to the control signals, and pressure sensors 168 installed on the vacuum lines 164 respectively for measuring the pressures in the vacuum lines 164. The pressure sensors 168 transmit pressure data to the control unit 170. The control unit 170 determines based on the input pressure data, whether or not the inside and outside proximity pins 120 and 130 are drawn onto the wafer by suction.

The control unit 170 controls the inside and outside proximate pins 120 and 130 such that the wafer is supported parallel to the heating plate 110 by the inside and outside proximate pins 120. Thus, the control unit 170 controls a process based on a shape of the wafer, and transmits the control signals to the vacuum device 160 and the driving device 150.

Figure 3:
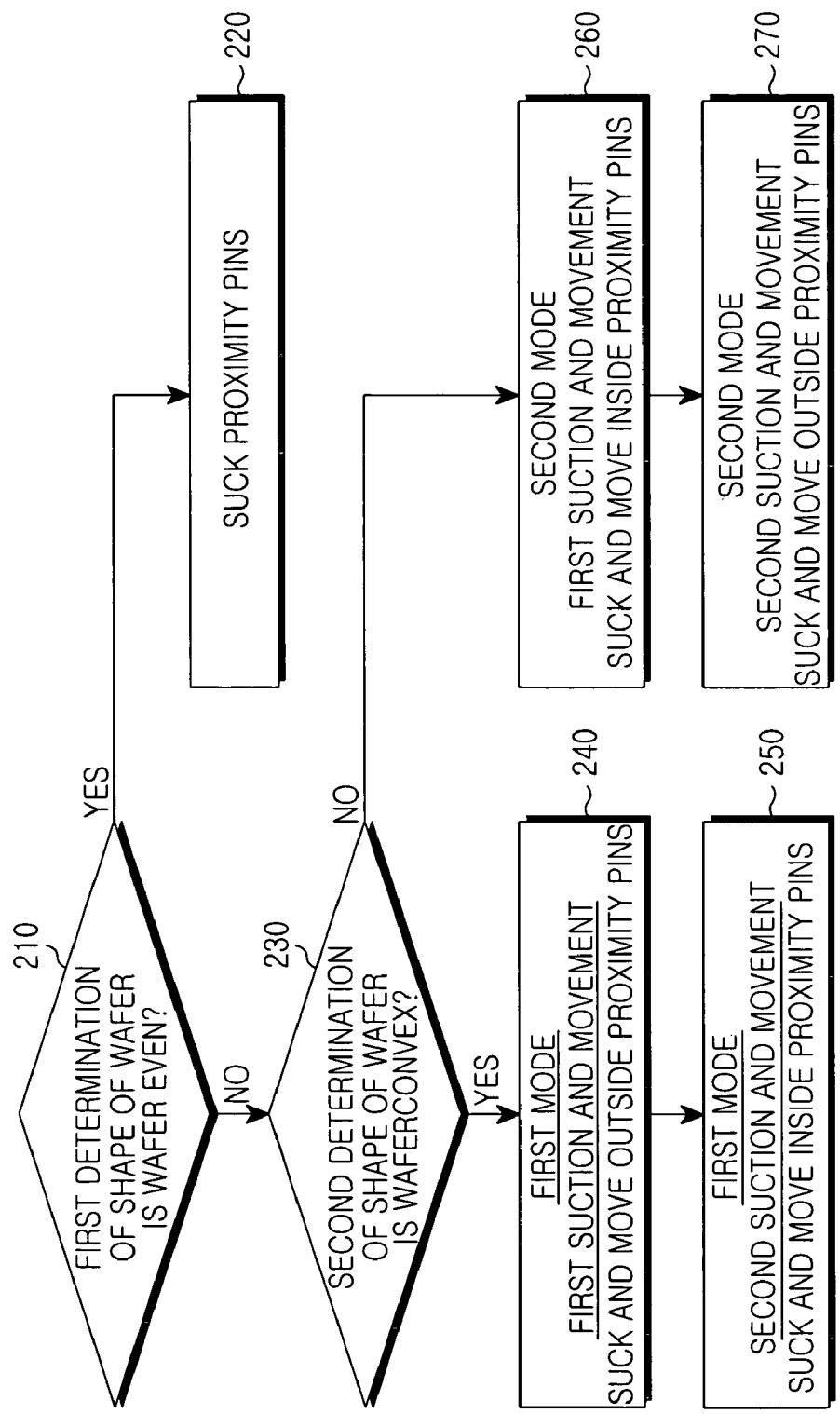
FIG. 3 is a flow chart illustrating a control unit of the wafer bake system illustrated in FIG. 2.

FIG. 3 is a flow chart illustrating the control unit 170 of the wafer bake system illustrated in FIG. 2. FIGS. 4 to 10 are cross-sectional views illustrating a control process of the control unit 170 of the wafer bake system illustrated in FIG. 2. The control process 170 includes the steps of first determining the shape of the wafer (S210), applying suction to the wafer (S220), secondarily determining the shape of the wafer (S230), first applying suction and moving pins (S240 and S260), and secondarily applying suction and moving other pins (S250 and S270).

Referring to FIG. 3, in step S210, the control unit 170 determines whether or not the surface of the wafer is even. The control unit 170 determines the shape of the wafer based on the gap data input from the gap sensors 142 and 144. When the surface of the wafer is even, the gap between the inside portion of the wafer and the inside portion of the heating plate 110 is the same as the gap between the outside portion of the wafer and the outside portion of the heating plate 110. However, when the surface of the wafer is uneven, the gap between the inside portion of the wafer and the inside portion of the heating plate 110 is different from the gap between the outside portion of the wafer and the outside portion of the heating plate 110. Thereafter, when the surface of the wafer is even, step S220 is performed. However, when the surface of the wafer is uneven, step S230 is performed.

Figure 4:
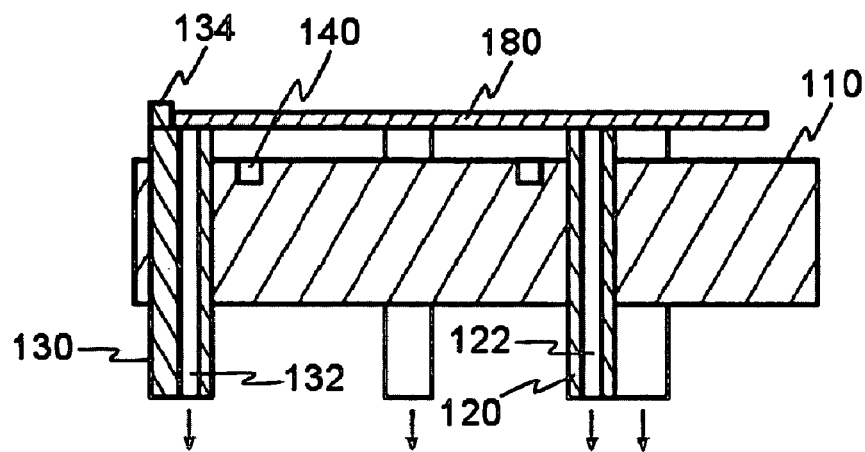
FIGS. 4 to 10 are side cross-sectional views illustrating a control process of the control unit of the wafer bake system illustrated in FIG. 2.

Referring to FIG. 4, in step S220, the valves 166 connected to the inside and outside proximity pins 120 and 130 are opened while the vacuum pump 162 is driven, thereby making the inside and outside proximity pins 120 and 130 to be drawn onto the wafer 180 by suction. As illustrated in FIG. 4, when the surface of the wafer is even, the gap between the wafer 180 and the heating plate 110 is uniform.

Referring to FIG. 3, in step S230, the control unit 170 determines whether the wafer is convex or concave. When the wafer is convex, the gap between the inside portion of the wafer and the inside portion of the heating plate 110 is larger than the gap between the outside portion of the wafer and the outside portion of the heating plate 110, and when the wafer is concave, the gap between the inside portion of the wafer and the inside portion of the heating plate 110 is smaller than the gap between the outside portion of the wafer and the outside portion of the heating plate 110. When the wafer is convex, the control unit 170 performs a first mode (S240 and S250). However, when the surface of the wafer is concave, the control unit 170 performs a second mode (S260 and S270).

Figure 5:
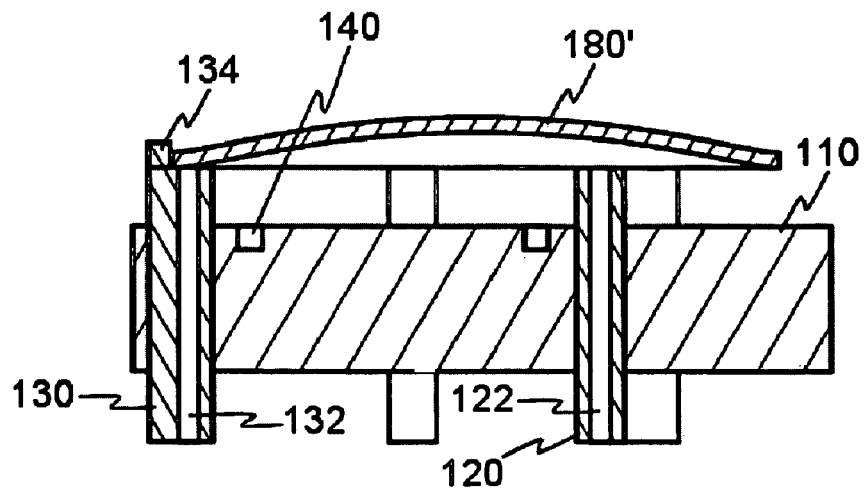
Figure 6:
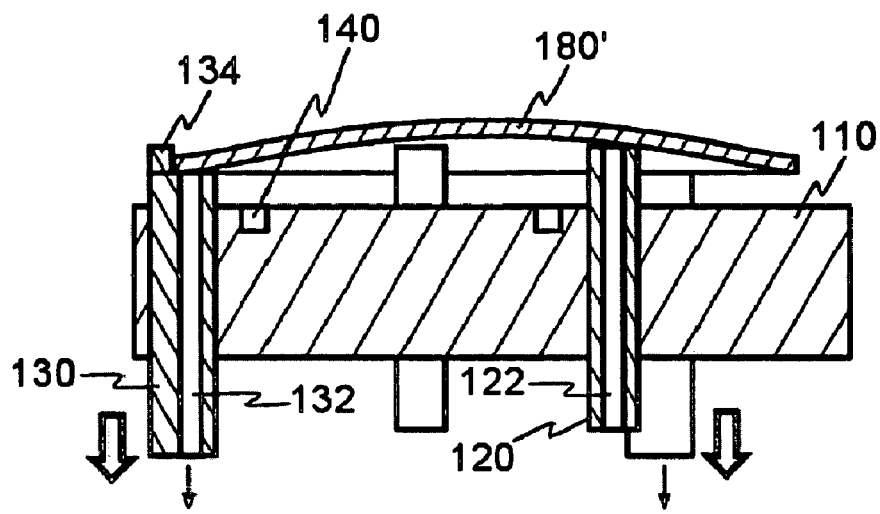
Figure 8:
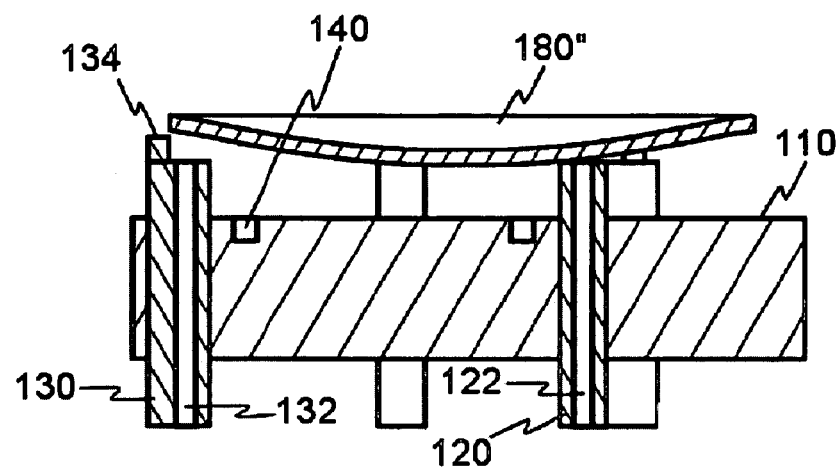
Figure 9:
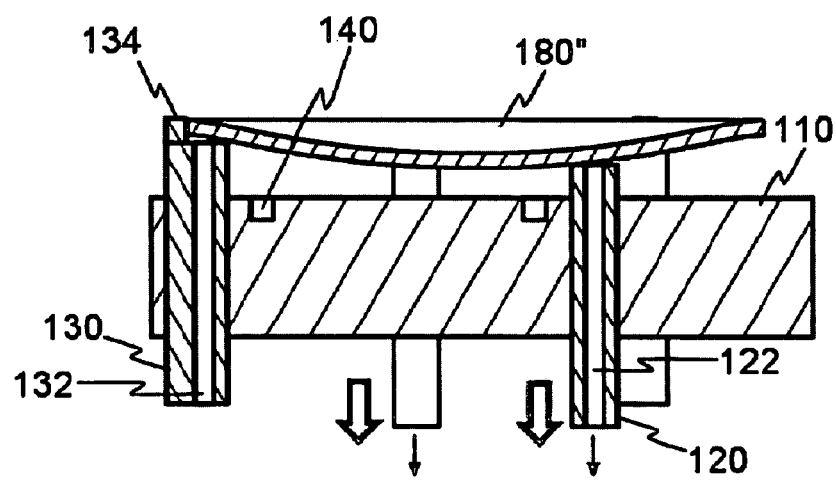

In steps of the first suction and movement (S240 and S260), the inside and outside proximity pins 120 and 130 are drawn onto the wafer by suction until the inside and outside proximity pins 120 and 130 contact the wafer, and then move downward. Steps S240 and S260 are selectively performed depending on whether the shape of the surface of the wafer is convex or concave. With reference to FIG. 5, a wafer 180' having a convex shape contacts the outside proximity pins 130 but does not contact the inside proximity pins 120. With reference to FIG. 6, the control unit 170 controls the outside proximity pins 130 to be drawn onto the wafer 180' by suction, and to move downward until the inside proximity pins 120 contact the wafer 180'. With reference to FIG. 8, a wafer 180" having a concave shape contacts the inside proximity pins 120 but does not contact the outside proximity pins 130. With reference to FIG. 9, the control unit 170 controls the inside proximity pins 120 to be drawn onto the wafer 180″ by suction, and to move downward until the outside proximity pins 130 contact the wafer 180″.

Figure 7:
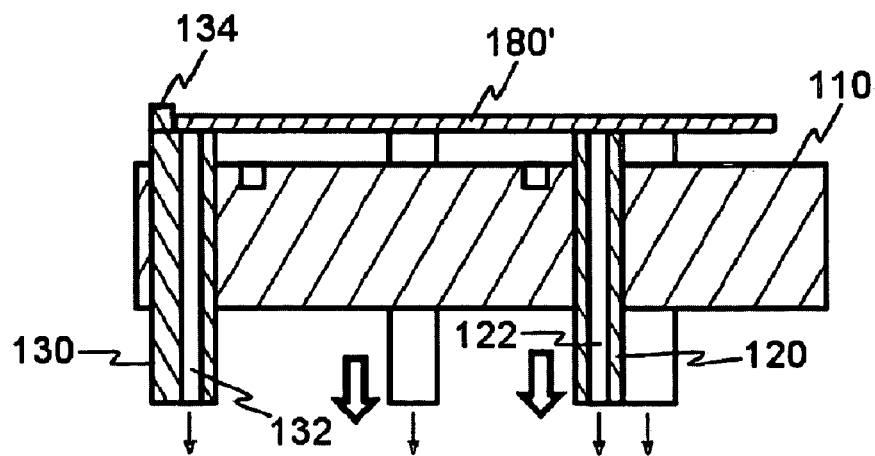
Figure 10:
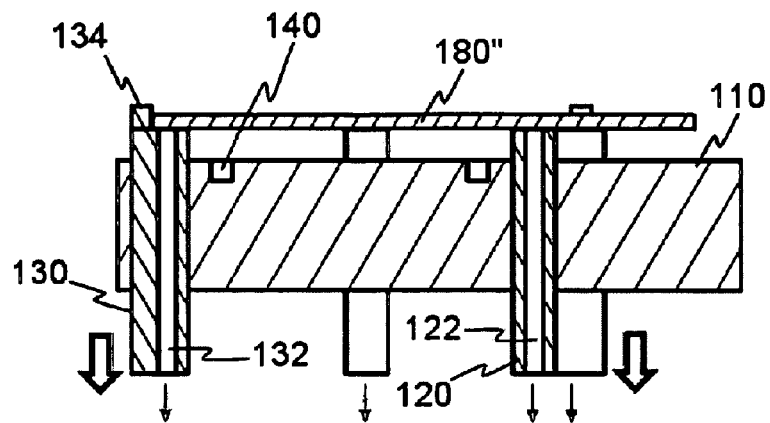

In steps of the second suction and movement (S250 and S270), when all of the inside and outside proximity pins 120 and 130 are drawn onto the wafer 180′ or 180″ by suction, the heights of the inside and outside proximity pins 120 and 130 are controlled, and thus the surface of the wafer 180′ or 180″ becomes even. Steps S250 and S270 are electively performed according to whether the uneven shape of the wafer 180′ or 180″ is convex or concave. With reference to FIG. 6, all of the inside and outside proximity pins 120 and 130 contact the wafer 180′, and the inside proximity pins 120 is higher than the outside proximity pins 130. With reference to FIG. 7, the control unit 170 controls the application of suction to draw the inside proximity pins 120 onto the wafer 180′, and moving the inside proximity pins 120 downward until the inside proximity pins 120 has the same height as the outside proximity pins 130. Accordingly, the wafer 180′ is supported by the inside and outside proximity pins 120 and 130 while maintaining in an even surface state. With reference to FIG. 9, all of the inside and outside proximity pins 120 and 130 contact the wafer 180″, and the outside proximity pins 130 is higher than the inside proximity pins 120. With reference to FIG. 10, the control unit 170 controls the application of suction to draw the outside proximity pins 130 onto the wafer 180″, and moving the outside proximity pins 130 downward until the inside proximity pins 120 has the same height as the outside proximity pins 130. Accordingly, the wafer 180′ is supported by the inside and outside proximity pins 120 and 130 while maintaining in an even surface state.

In the above-described embodiment of the present invention, the wafer bake system 100 illustrated in FIG. 2 transforms the wafer having an uneven surface into an even surface. Furthermore, any shape of wafer can be controlled by the system 100. For example, the system 100 may be installed in a chamber (not shown) in which temperature distribution is not uniform, thereby generating a temperature gradient on the even surface of the wafer. Accordingly, the system 100 transforms a wafer having an even surface into an uneven surface, or controls the unevenness of the wafer having an uneven surface, by generating the temperature gradient in the wafer. The system 100 measures the distribution of the gap between the wafer and the heating plate 110 using a plurality of the gap sensors 142 and 144, and controls the shape of the wafer based on the measured distribution of the gap.

Hereinafter, a second preferred embodiment of the present invention will be described with reference to FIGS. 11–13.

Figure 11:
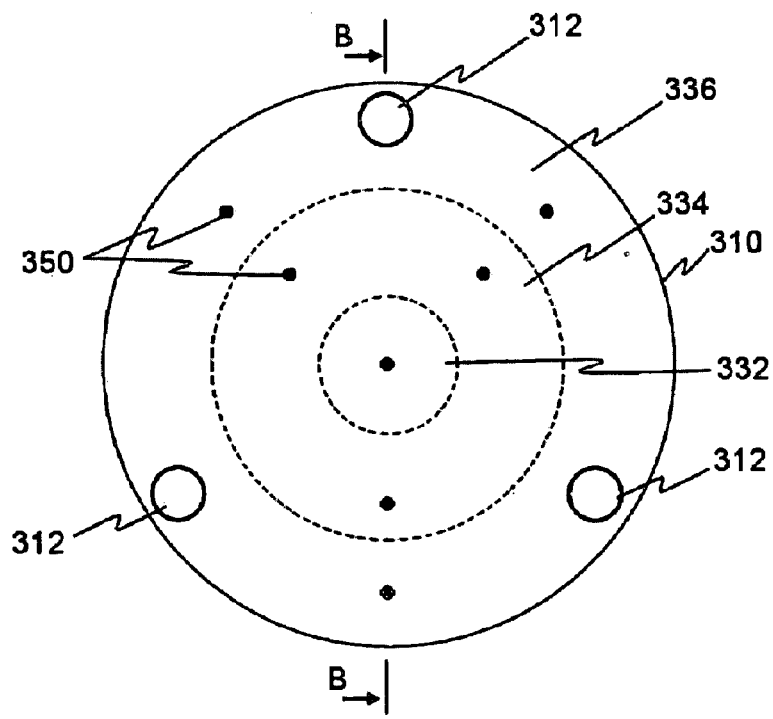
FIG. 11 is a plan view of a heating plate in accordance with a second preferred embodiment of the present invention.

FIG. 11 is a plan view of a heating plate in accordance with a second preferred embodiment of the present invention. FIG. 12 is a cross-sectional view taken along the line B–B' of FIG. 11, illustrating the constitution of a wafer bake system in accordance with the second preferred embodiment of the present invention. The wafer bake system 300 includes a heating plate 310, proximity pins 320, gap sensors 350, a vacuum device 370, a driving device 360, and a control unit 380.

Referring to FIG. 11, the heating plate 310 includes three first through holes 312 formed through the outside portion of the heating plate 310, and the first through holes 312 are disposed at vertices of an imaginary regular triangle, respectively. The number and arrangement of the first through holes 312 are designed such that the proximity pins 320 stably support a wafer. Accordingly, any number and arrangement of the first through holes 312 can be selected.

The heating plate 310 includes a plurality of heaters 340 formed on a lower surface thereof and arranged such that first, second and third heating zones 332, 334 and 336 are distributed along a radial direction of the heating plate 310. Therefore, the control unit 380 effectively controls the temperature gradient in the heating plate 310 using the heaters 340.

Figure 12:
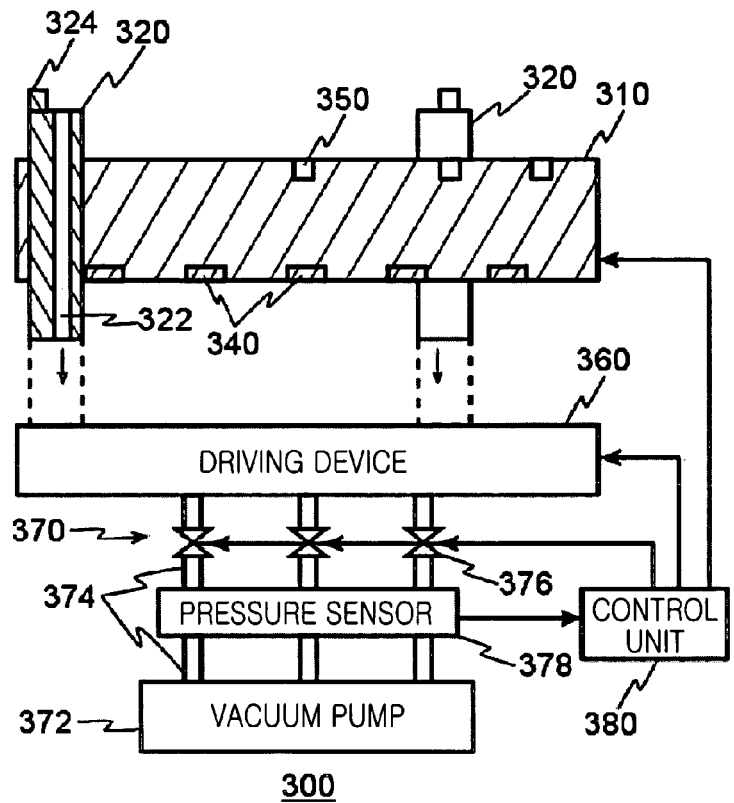
FIG. 12 is a side cross-sectional view illustrating the constitution of a wafer bake system in accordance with the second preferred embodiment of the present invention.

Referring to FIG. 12, the proximity pins 320 are inserted into the through holes 312 so that the proximity pins 320 partially protrudes from an upper surface of the heating plate 310, and respectively include second through holes 322 formed therein. The proximity pins 320 move vertically, and are drawn onto the wafer by suction. Each of the proximity pins 320 includes a guide 324 protruding from the upper end thereof, and the guides 324 prevent the wafer from deviating from a predetermined position and moving in parallel with the movement of the heating plate 310. When the wafer deviates from the predetermined position and then moves parallel, a side surface of the wafer contacts the guides 324, thereby stopping the movement of the wafer.

A plurality of the gap sensors 350 are provided throughout the upper surface of the heating plate 310, and measure a gap between the wafer and the heating plate 310 and to transmit the measured gap data to the control unit 380. Optical gap sensors, for emitting light to the lower surface of the wafer and obtaining the gap data using the light reflected from the lower surface of the wafer, or capacitive gap sensors, for obtaining the gap data using the variation in capacitance according to the variation in the gap between the wafer and the heating plate 110, may be used as the gap sensors 350.

The driving device 360 controls the movement of the proximate pins 320, and moves the proximate pins 320 along the corresponding through holes 312 upwards or downward based on the control signals. For example, the driving device 360 includes a plurality of piezoelectric devices, which are provided with ends connected to the lower ends of the proximity pins 320 and can expand or contract in the longitudinal direction of the proximity pins 320.

The vacuum device 370 is connected to the second through holes 322 of the proximity pins 320, and exhausts gas in the second through holes 322 so that the proximity pins 320 are drawn onto the wafer by suction. Accordingly, the vacuum device 370 includes a plurality of vacuum lines 374 connected to the second through holes 322 respectively, a vacuum pump 372 connected to the vacuum lines 374, a plurality of valves 376 provided on the vacuum lines 374 respectively and opened and closed according to the control signals, and pressure sensors 378 installed on the vacuum lines 374 respectively for measuring the pressures in the vacuum lines 374. The pressure sensors 378 transmit pressure data to the control unit 380. The control unit 380 determines, based on the input pressure data, whether or not the proximity pins 380 are drawn onto the wafer by suction.

Figure 13:
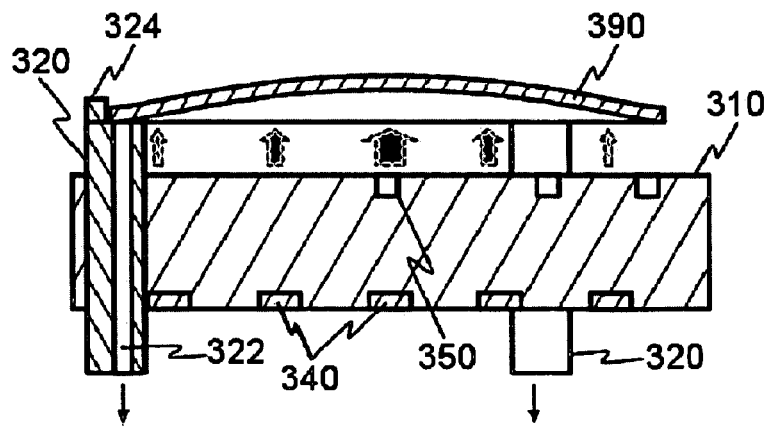
FIG. 13 is a side cross-sectional view illustrating a control process of a control unit of the wafer bake system illustrated in FIG. 12.

FIG. 13 is a cross-sectional view illustrating a control process of the control unit 380. As illustrated in FIG. 13, a wafer 390 is mounted on the proximity pins 320. The control unit 380 determines, based on the gap data input from the gap sensors 350, whether or not the wafer 390 is convex. The control unit 380 opens all of the valves 376 connected to the proximity pins 320 when the vacuum pump 372 is driven, thereby making the proximity pins 320 to be drawn onto the wafer 390 by suction. Thereafter, in order to uniformly bake the overall surface of the wafer 390, the heating temperature of the heaters 340 disposed in the first heating zone 332 is the highest, and the heating temperature of the heaters 340 disposed in the third heating zone 336 is the lowest. Accordingly, the central portion of the wafer 390 is heated to the highest temperature and the outside portion of the wafer 390 is heated to the lowest temperature. When a wafer having a concave shape is mounted on the heating plate 310, the heating temperature of the heaters 340 disposed in the third heating zone 336 is the highest, and the heating temperature of the heaters 340 disposed in the first heating zone 332 is the lowest.

From the above description, the present invention provides a wafer bake system, in which gap distribution between a wafer and a heating plate is measured and a temperature gradient of the wafer is controlled by the measured gap distribution, thereby having several advantages, as follows.

First, the wafer bake system of the present invention eliminates the generation of the temperature gradient in the wafer due to the deformation of the wafer when the wafer is baked, thus easily controlling critical dimensions of the wafer.

Second, while the conventional wafer bake system includes large-sized and expensive devices for preventing the generation in the temperature gradient of the wafer when the wafer is baked, the wafer bake system of the present invention does not require the above-described devices.

Third, the wafer bake system of the present invention copes with the deformation of the wafer generated in steps of a wafer fabrication process, thus easily controlling uniformity in the temperature of the wafer.

Fourth, the wafer bake system of the present invention preferably uses a heating plate or a heat pipe plate, thus easily controlling uniformity of the temperature of the wafer.

Although preferred embodiments of the present invention have been described in detail, those skilled in the art will appreciate that various modifications, additions, and substitutions to the specific elements are possible, without departing from the scope and spirit of the invention as disclosed in the accompanying claims.

What is claimed is:

1. A wafer bake system comprising:
    a heating plate for heating a wafer;
    a supporting unit for supporting the wafer to be spaced from the heating plate, the supporting unit being inserted into first through holes thereby moving vertically; and
    a plurality of proximity pins, each of the proximity pins including a second through hole formed therein, so that the proximity pins are drawn onto the wafer by suction,
    wherein a gap distribution between the wafer and the heating plate is measured, and a temperature gradient in the wafer is controlled based on the measured gap distribution.

2. The wafer bake system as set forth in claim 1, further comprising:
    a plurality of sensors for measuring the gap distribution between the wafer and the heating plate; and
    a control unit for controlling the supporting unit to control a shape of the wafer based on the measured gap distribution.

3. The wafer bake system as set forth in claim 1, wherein the proximity pins include at least one guide protruding from the upper end thereof.

4. The wafer bake system as set forth in claim 1, wherein the supporting unit includes:
    a vacuum device connected to the second through holes of the proximity pins for exhausting gas in the second through holes so that the proximity pins are drawn onto the wafer by suction; and
    a driving device for moving the proximity pins upward and downward along the second through holes.

5. The wafer bake system as set forth in claim 4, wherein the vacuum device includes:
    a plurality of vacuum lines connected to the second through holes respectively; and
    a vacuum pump connected to the vacuum lines.

6. The wafer bake system as set forth in claim 5, wherein the vacuum device further includes a plurality of pressure sensors for pressures in the corresponding vacuum lines respectively.

7. The wafer bake system as set forth in claim 5, wherein the vacuum device further includes a plurality of valves provided at the vacuum lines respectively for opening and closing the vacuum lines.

8. The wafer bake system as set forth in claim 1, further comprising:
    a plurality of gap sensors for measuring the gap distribution between the wafer and the heating plate;
    a plurality of heaters arranged such that a plurality of heating zones are formed on the heating plate along the radial direction of the heating plate; and
    a control unit for controlling the heaters to regulate the temperature gradient on the surface of the heating plate using the sensed gap distribution.

9. A method for operating a wafer bake system including a heating plate for heating a wafer, a supporting unit for supporting the wafer to be spaced from the heating plate, and a plurality of proximity pins, comprising the steps of:
    (a) mounting a wafer having an uneven surface on the supporting unit;
    (b) controlling a height of the wafer contacting the supporting unit;
    (c) fixing the plurality of proximity pins to the wafer by drawing the proximity pins onto the wafer by suction, and deforming the wafer using the proximity pins.

* * * * *